(12) United States Patent
Ueno et al.

(10) Patent No.: US 9,238,720 B2
(45) Date of Patent: Jan. 19, 2016

(54) PREPREG AND LAMINATE

(75) Inventors: Masayoshi Ueno, Tokyo (JP); Yoshihiro Kato, Tokyo (JP); Takeshi Nobukuni, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 781 days.

(21) Appl. No.: 13/202,829

(22) PCT Filed: Feb. 16, 2010

(86) PCT No.: PCT/JP2010/000953
§ 371 (c)(1),
(2), (4) Date: Sep. 27, 2011

(87) PCT Pub. No.: WO2010/098037
PCT Pub. Date: Sep. 2, 2010

(65) Prior Publication Data
US 2012/0009836 A1 Jan. 12, 2012

(30) Foreign Application Priority Data

Feb. 25, 2009 (JP) ................................. 2009-042683

(51) Int. Cl.
*B32B 5/24* (2006.01)
*C08J 5/24* (2006.01)
*B32B 15/08* (2006.01)
*B32B 15/20* (2006.01)
*B32B 17/04* (2006.01)
*B32B 27/04* (2006.01)
*B32B 27/38* (2006.01)
*D03D 13/00* (2006.01)
*D03D 15/00* (2006.01)
*H05K 1/03* (2006.01)

(52) U.S. Cl.
CPC . *C08J 5/24* (2013.01); *B32B 15/08* (2013.01); *B32B 15/20* (2013.01); *B32B 17/04* (2013.01); *B32B 27/04* (2013.01); *B32B 27/38* (2013.01); *D03D 13/008* (2013.01); *D03D 15/0011* (2013.01); *H05K 1/0366* (2013.01); *C08J 2363/00* (2013.01); *D10B 2505/02* (2013.01); *H05K 2201/029* (2013.01); *Y10T 442/20* (2015.04)

(58) Field of Classification Search
CPC .................................... B32B 5/02; B32B 5/24
USPC ........................................................ 442/59
See application file for complete search history.

(56) References Cited

U.S. PATENT DOCUMENTS

2009/0017316 A1 1/2009 Kato et al.

FOREIGN PATENT DOCUMENTS

| CN | 101240111 | 8/2008 |
|---|---|---|
| EP | 1961554 | 8/2008 |
| JP | 5-261861 | 10/1993 |
| JP | 5-283828 | 10/1993 |
| JP | 2744866 | 4/1998 |
| JP | 11-124433 | 5/1999 |
| JP | 2001-329080 | * 11/2001 |
| JP | 2003-73543 | 3/2003 |
| JP | 2006/28686 | 2/2006 |
| JP | 2009-35728 | 2/2009 |

OTHER PUBLICATIONS

Office Action issued Jun. 30, 2015 by Malaysian Patent Office in PI 2011 003977.
Japan Office action, dated Aug. 5, 2014 along with an English translation thereof.
Search report from E.P.O., mail date is Mar. 23, 2015.
Taiwan Office action, dated Mar. 13, 2015 along with an English translation thereof.
Chinese Office action, dated May 9, 2013 along with an English translation thereof.
Taiwan Office action, dated Jul. 17, 2013 along with an english translation thereof.
China Office action, dated Aug. 1, 2013 along with an english translation thereof.
China Office action, dated Feb. 18, 2014 along with an English translation thereof.

* cited by examiner

*Primary Examiner* — Jennifer Chriss
*Assistant Examiner* — Camie Thompson
(74) *Attorney, Agent, or Firm* — Greenblum & Bernstein, P.L.C.

(57) ABSTRACT

This invention relates to a prepreg having a low thermal expansion coefficient in plane direction and a high rigidity, and more particularly to a prepreg comprising a glass cloth (A), and a resin composition including a cyanate ester resin (B), a non-halogen based epoxy resin (C) and an inorganic filler (D), wherein the glass cloth (A) is characterized that when the weight per 1 $m^2$ is W ($g/m^2$), the thickness is t (μm), the number of warp threads per inch is X (thread/inch), and the number of weft threads per inch is Y (thread/inch), the total of X and Y is 150 to 240, t is 17 to 35, and the value of W/t as the apparent density is 1.1 to 1.5, and that the volume fraction of the glass cloth (A) in the prepreg is 32% to 42%.

6 Claims, No Drawings

PREPREG AND LAMINATE

TECHNICAL FIELD

This invention relates to a prepreg for printed wiring boards, a laminate and a metal foil-clad laminate using the prepreg.

RELATED ART

The printed wiring boards widely used in electronic devices, communication instruments, personal computers and the like are developed with the advance of high densification and high integration. As a metal foil-clad laminate used in the printed wiring board is required a laminate having excellent properties such as heat resistance, low water absorbency, hygroscopic heat resistance and insulation reliability associated therewith. Heretofore, as a laminate for the printed wiring board has been widely used an FR-4 type laminate obtained by setting an epoxy resin with dicyandiamide. In the technique of setting the epoxy resin with dicyandiamide, however, there is a limitation in responding to the demand for high heat resistance. Also, a cyanate resin is known as a resin for the printed wiring board having an excellent heat resistance, and a resin composition based on a bisphenol A type cyanate resin and another thermosetting resin or thermoplastic resin is widely used in materials for high-performance printed wiring boards such as semiconductor plastic packages and so on in recent years. Although this bisphenol A type cyanate resin is excellent in the electrical properties, mechanical properties, chemical resistance, adhesion properties and the like, other cyanate resins have also been investigated for satisfying requirements such as water absorbency and hygroscopic heat resistance under severer conditions for further improving properties of a material for printed wiring boards.

Also, in order to impart flame retardance to the laminate, a formulation combined with a bromine based flame retardant has been used. However, a resin composition using no halogen based compound is demanded in response to the recently heightened environmental issues, and hence the use of a phosphorous compound is examined instead of the halogen based flame retardant associated with such a demand. However, since the phosphorous compound may have fear of generating a toxic compound such as phosphine or the like upon combustion, it is desired to develop a laminate having flame retardance without using the halogen based compound and phosphorous compound.

For the purpose of developing materials for printed wiring boards having excellent water absorbency and hygroscopic heat resistance and a flame retardance without using the halogen based compound and phosphorous compound, there are examined cyanate resins other than the above bisphenol A type cyanate resin. As the cyanate having a structure different from the bisphenol A type cyanate is known a novolac type cyanate (e.g., see Patent Document 1). However, although the phenol novolac type cyanate is excellent in the flame retardance but is small in the cyanate group equivalent, many unreacted cyanate groups tend to remain during the curing due to the rigid skeleton structure, and hence further studies are conducted so as to meet the demands such as water absorbency, hygroscopic heat resistance and the like.

Moreover, it is known that upon thinning of the material for the printed wiring board is decreased rigidity of a laminate material for the printed wiring board to cause warpage due to the difference in thermal expansion coefficient in plane direction between a semiconductor element and a printed wiring board for semiconductor plastic package. By such a warpage may be caused poor connection between the semiconductor element and the printed wiring board for the semiconductor plastic package or between the semiconductor plastic package and the printed wiring board to be mounted thereon. Thus, in order to reduce the warpage, the laminate material for the printed wiring board is demanded to be low in the thermal expansion coefficient in the plane direction and high in the rigidity.

Heretofore, as a method of enhancing the rigidity of the laminate and reducing the thermal expansion coefficient are known a method of using a high-strength glass cloth containing a lot of $SiO_2$ and $Al_2O_3$ (e.g., see the following Patent Document 2) and a method of highly filling a filler (e.g., see the following Patent Document 3), and also as another method of enhancing the rigidity of the laminate is known a method of using a glass cloth having one-side raised surface (e.g., see the following Patent Document 4). However, both the use of the high-strength glass cloth and the method of highly filling the filler have a problem of decreasing drillability.

PRIOR ART DOCUMENTS

Patent Documents

Patent Document 1: JP-A-H11-124433
Patent Document 2: JP-A-H05-261861
Patent Document 3: JP-A-2003-73543
Patent Document 4: JP-A-2006-28686

SUMMARY OF THE INVENTION

Problems to be Solved by the Invention

With the view of the laminate having a high rigidity and a low thermal expansion coefficient, as an end count of threads in the glass cloth used becomes large, the thickness of the glass cloth becomes thick, which is not suitable for thinning the laminate. As regards thin glass cloths having a glass cloth thickness t of 17 to 35 (μm), when the weight per unit area of the glass cloth is W (g/m$^2$), only light glass cloths with W/t of less than 1.1 are existent, and hence a laminate having a sufficient rigidity cannot be obtained. Therefore, it is an object of the invention to provide a thinned laminate for printed wiring boards having a high rigidity and a small thermal expansion coefficient in plane direction, and a prepreg for producing the laminate.

Means for Solving Problems

The inventors have found out that a laminate having a small thermal expansion coefficient in plane direction and a high rigidity can be obtained by curing a prepreg wherein a certain glass cloth is impregnated with a resin composition comprising a cyanate resin, a non-halogen based epoxy resin and an inorganic filler, and as a result, the invention has been accomplished.

More specifically, the invention is a prepreg composed of (A) a glass cloth with a resin composition comprising (B) a cyanate resin, (C) a non-halogen based epoxy resin and (D) an inorganic filler, characterized in that when weight per 1 m$^2$ in said glass cloth (A) is W (g/m$^2$), thickness is t (μm), end count of warp threads per inch is X (thread/inch), and end count of weft threads per inch is Y (thread/inch), the total of X and Y is 150 to 240, t is 17 to 35, and the value of W/t as an apparent density is 1.1 to 1.5, and that volume content of the glass cloth (A) in the prepreg is 32% to 42%.

Furthermore, in the invention, the cyanate resin (B) in the resin composition constituting the prepreg is preferable to be a cyanate resin represented by the following general formula (1):

[Chemical Formula 1]

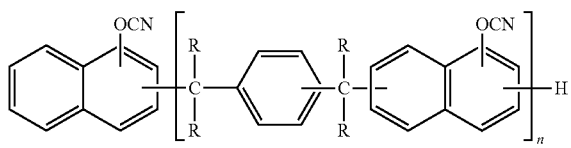

(1)

(wherein each R independently represents a hydrogen atom or a methyl group, and n represents an integer of not less than 1).

Also, the invention is a laminate obtained by curing the above prepreg, and a metal foil-clad laminate obtained by curing a laminate of the above prepreg and a metal foil.

Effect of the Invention

The laminate and metal foil-clad laminate obtained by curing the prepreg according to the invention are high in the rigidity and low in the thermal expansion coefficient. Therefore, the prepreg of the invention is preferred as a material for semiconductor plastic packages which are required to be thin and highly reliable. More specifically, according to the invention, it is possible to provide a printed wiring board for semiconductor plastic packages with improved connection reliability when a semiconductor element is mounted thereon.

EMBODIMENTS FOR CARRYING OUT THE INVENTION

The prepreg of the invention is composed of (A) a glass cloth having specified weight W (g/m$^2$) per 1 m$^2$ of the glass cloth, thickness t (μm) of the glass cloth, end count X (thread/inch) of warp threads per inch and end count Y (thread/inch) of weft threads per inch, and a resin composition comprising (B) a cyanate ester resin, (C) a non-halogen based epoxy resin and (D) an inorganic filler.

The glass cloth (A) used in the prepreg of the invention is preferably a glass cloth wherein a cross section of each yarn constituting the glass cloth is flattened to make flexion of straightforward yarns small. It is not particularly limited as long as when the weight per 1 m$^2$ of the glass cloth is W (g/m$^2$), the thickness of the glass cloth is t (μm), the end count of warp threads per inch (2.54 cm) (i.e., weaving density of warp threads) is X (thread/inch), and the end count of weft threads per inch (2.54 cm) (i.e., weaving density of weft threads) is Y (thread/inch), the total of X and Y is 150 to 240, t is 17 to 35, the value of W/t is 1.1 to 1.5. Preferably, W/t is 1.1 to 1.4, and also the total of X and Y is preferably 150 to 200, more preferably 150 to 170. W/t has a dimension of g/cm$^3$, and is an apparent density including gap spaces in the weaving structure of the glass cloth. In the glass cloth, when the weight W per unit area is heavy, the thickness becomes thick, while when the thickness t is thin, the weight W per unit area becomes light, so that it is conventionally impossible to manufacture a glass cloth establishing a heavy weight and a thin thickness, that is a glass cloth having a high apparent density. When the value of W/t is less than 1.1, the effect of decreasing the thermal expansion coefficient is small, while when it exceeds 1.5, the formability is unfavorably deteriorated. Also, when t is less than 17 μm, the rigidity of the resulting laminate becomes low, while when t exceeds than 35 μm, it is difficult to manufacture a target thin laminate. Moreover, when the total of X and Y is less than 150, the rigidity of the resulting laminate becomes low and the thermal expansion coefficient becomes high, while when the total of X and Y exceeds 240, it is difficult to manufacture a target thin laminate.

As the above glass cloth (A), it is preferable to be a woven fabric made from yarns each being a bundle of 75 to 150 glass monofilaments with an average diameter in section of 3.5 to 5.1 μm. When using a glass cloth obtained from yarns each being a bundle of 75 or more glass monofilaments with an average diameter in section of more than 5.1 μm, and having the total of X and Y of not less than 150, the thickness of the prepreg increases, which is not preferable. Preferably, there may be included a glass cloth made from yarns (BC1500) each being a bundle of 100 glass monofilaments with an average diameter in section of 3.5 to 4.7 μm and having the total of X and Y of 150 to 240 and t of 17 to 25 μm, a glass cloth made from yarns (C1200) each being a bundle of 100 glass monofilaments with an average diameter in section of 3.5 to 5.1 μm and having the total of X and Y of 150 to 240 and t of 20 to 28 μm, and so on.

The weaving type of the glass cloth (A) is not particularly limited, and can utilize well-known ones. Also, as a material of the glass cloth can be used well-known ones used in various types of printed wiring board materials. For example, the material of the glass cloth includes glass fibers such as E-glass, D-glass, S-glass, NE-glass and T-glass, but E-glass can be preferably used in terms of drillability.

As the cyanate resin (B) used in the resin composition constituting the prepreg of the invention can be typically used any well-known cyanate resins. For example, the cyanate resin (B) includes 1,3-dicyanato benzene, 1,4-dicyanato benzene, 1,3,5-tricyanato benzene, bis(3,5-dimethyl-4-cyanatophenyl)methane, 1,3-dicyanato naphthalene, 1,4-dicyanato naphthalene, 1,6-dicyanato naphthalene, 1,8-dicyanato naphthalene, 2,6-dicyanato naphthalene, 2,7-dicyanato naphthalene, 1,3,6-tricyanato naphthalene, 4,4'-dicyanatobiphenyl, bis(4-cyanatophenyl)methane, 2,2'-bis(4-cyanatophenyl)propane, bis(4-cyanatophenyl)ether, bis(4-cyanatophenyl)thioether, bis(4-cyanatophenyl)sulfone, a phenol novolac type cyanate, and a naphtol aralkyl type cyanate represented by the above general formula (1). In order to enhance flame retardance, the cyanate resin represented by the above general formula (1) can be preferably used. A resin composition including the naphtol aralkyl type cyanate can be preferably used since heat resistance can be maintained by a feature that the resin skeleton is a rigid structure but also the reaction inhibiting factors are reduced to enhance the curing property and the properties such as water absorbency and hygroscopic heat resistance are excellent.

The non-halogen based epoxy resin (C) used in the resin composition constituting the prepreg of the invention is not particularly limited as long as it is a compound having two or more epoxy groups in its molecule and intentionally containing no halogen atom in its molecular skeleton. For example, the non-halogen based epoxy resin (C) includes a bisphenol A type epoxy resin, a bisphenol F type epoxy resin, a phenol novolac type epoxy resin, a cresol novolac type epoxy resin, a bisphenol A novolac type epoxy resin, a trifunctional phenol type epoxy resin, a tetrafunctional phenol type epoxy resin, a naphthalene type epoxy resin, a biphenyl type epoxy resin, an aralkyl novolac type epoxy resin, a cycloaliphatic epoxy resin, a polyol type epoxy resin, a compound obtained by epoxidizing a double bond in glycidylamine, glycidylester, butadiene or the like, a compound obtained by reaction of hydroxyl group containing silicone resins with epichlorohydrin, and so on. Particularly, the aralkyl novolac type epoxy resin is preferable in order to improve the flame retardance. The aralkyl novolac type epoxy resin used herein is represented by the following general formula (2), and specifically includes a phenol phenyl aralkyl type epoxy resin, a phenol biphenyl aralkyl type epoxy resin, a naphthol aralkyl type epoxy resin and the like. These non-halogen based epoxy resins (C) may be used alone or in a combination of two or more properly.

[Chemical Formula 2]

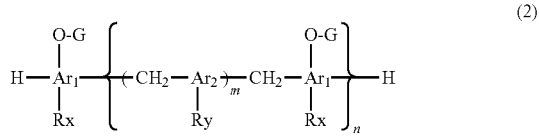

(2)

(In the formula, G represents a glycidyl group, $Ar_1$ represents a quadrivalent aromatic group having as a substituent a monocyclic or polycyclic aromatic hydrocarbon such as benzenetetrayl group, a naphthalenetetrayl group and a biphenyltetrayl group, $Ar_2$ represents a trivalent aromatic group having as a substituent a monocyclic or polycyclic aromatic hydrocarbon such as benzenetriyl group, a naphthalenetriyl group and a biphenyltriyl group, each of Rx and Ry independently represents a hydrogen atom, an alkyl group or an aryl group, m is an integer from 1 to 5, and n is an integer from 1 to 50).

The cyanate resin (B) and the non-halogen based epoxy resin (C) used in the invention are preferable to be blended in such a manner that a ratio of the number of cyanate groups (CN) of the cyanate resin (B) to the number of epoxy groups (Ep) of the non-halogen based epoxy resin (C) in the resin composition is 0.3 to 2.5. When the ratio CN/Ep is less than 0.3, the flame retardance of the laminate is deteriorated, while when it exceeds 2.5, the curing property and the like may be deteriorated.

The inorganic filler (D) used in the resin composition constituting the prepreg of the invention includes, for example, silicas such as natural silica, fused silica, amorphous silica, hollow silica and the like; boehmite; molybdenum compounds such as molybdenum oxide and zinc molybdenum; alumina, talc, calcined talc, mica, glass short fiber, spherical glass (fine powder of glass such as E-glass, T-glass and D-glass) and so on. The average particle size (D50) of the inorganic filler (D) used is not particularly limited, but the average particle size (D50) is preferably 0.2 to 5 μm in view of dispersion properties. Also, the amount of the inorganic filler (D) compounded is preferably 33% by weight to 60% by weight of the resin composition constituting the prepreg, more preferably 33% by weight to 57% by weight. When the amount of the inorganic filler (D) compounded exceeds 60% by weight of the resin composition constituting the prepreg, the formability may be deteriorated, while when it is less than 33% by volume, the thermal expansion coefficient may increase. These inorganic fillers (D) may be used alone or in a combination of two or more properly.

With respect to the compounded inorganic filler (D), it is also possible to use a silane coupling agent or a wet dispersant together. The silane coupling agent is not particularly limited as long as it is a silane coupling agent generally used in the surface treatment of inorganic substances. As a concrete example of the silane coupling agent are mentioned amino silane based compounds such as γ-aminopropyl triethoxy silane, N-β-(aminoethyl)-γ-aminopropyl trimethoxy silane and the like; epoxy silane based compounds such as γ-glycidoxypropyl trimethoxy silane and the like; vinyl silane based compounds such as γ-methacryloxypropyl trimethoxy silane and the like; cationic silane based compounds such as N-β-(N-vinylbenzilaminoethyl)-γ-aminopropyl trimethoxy silane hydrochloride and the like; phenyl silane based compounds and so on. They may be used alone or in a combination of two or more properly. Also, the wet dispersant is not particularly limited as long as it is a dispersion stabilizer used for painting. For example, wet dispersants such as Disperbyk-110, 111, 180, 161, BYK-W996, W9010 and W903 made by BYK-Chemie Japan are included.

In the resin composition constituting the prepreg of the invention, it is also possible to use a maleimide compound together. The maleimide compound is not particularly limited as long as it has one or more maleimide groups in its molecule. As a concrete example of the maleimide compound are mentioned bis(4-maleidophenyl)methane, 2,2-bis[4-(4-maleimidophenoxy)-phenyl]propane, bis(3,5-dimethyl-4-maleimidophenyl)methane, bis(3-ethyl-5-methyl-4-maleimidophenyl)methane, bis(3,5-diethyl-4-maleimidophenyl) methane, polyphenyl methane maleimide, prepolymers of these maleimide compounds, or prepolymers of a maleimide compound and an amine compound and so on. They may be used alone or in a combination of two or more properly. More preferred maleimide compounds include bis(4-maleimidophenyl)methane, 2,2-bis[4-(4-maleimidophenoxy)-phenyl]propane, and bis(3-ethyl-5-methyl-4-maleimidophenyl) methane.

In the resin composition constituting the prepreg of the invention, it is also possible to use a curing accelerator together, if required, so as to adjust the curing speed properly. The curing accelerator is not particularly limited as long as it is ones usually used as a curing accelerator for the cyanate resin (B) and the non-halogen based epoxy resin (C). As a concrete example of the curing accelerator are mentioned organic salts of a metal such as copper, zinc, cobalt and nickel; imidazoles and derivatives thereof, tertiary amines and so on.

In the resin composition constituting the prepreg of the invention, it is also possible to use various polymer compounds such as other thermosetting resins, thermoplastic resins and oligomers and elastomers thereof; other flame retardant compounds, additives and so on together within a range of not damaging the desired properties. These compounds are not particularly limited as long as they are generally used. For example, as the flame retardant compound are included nitrogen-containing compounds such as melamine, benzoguanamine and the like; oxazine ring-containing compounds and so on. As the additive are mentioned UV absorber, antioxidant, photopolymerization initiator, fluorescent brightener, photosensitizer, dye, pigment, thickener, lubricant, defoamer, dispersant, leveling agent, brightener, polymerization inhibitor and the like, which are also possible to be used in a proper combination, if desired.

The method of producing the prepreg according to the invention is not particularly limited as long as it is a method for producing a prepreg composed of a glass cloth (A), wherein when the weight per 1 $m^2$ of the glass cloth is W (g/$m^2$), the thickness of the glass cloth is t (μm), the end count of warp threads per inch (2.54 cm) (i.e., weaving density of warp threads) is X (thread/inch), and the end count of weft threads per inch (2.54 cm) (i.e., weaving density of weft threads) is Y (thread/inch), the total of X and Y is 150 to 240, t is 17 to 35, the value of W/t is 1.1 to 1.5, and a resin composition including a cyanate resin (B), a non-halogen based epoxy resin (C) and an inorganic filler (D), and wherein the volume content of the glass cloth in the prepreg is 32% to 42%. For example, there is mentioned a method of producing a prepreg wherein a resin varnish including the resin composition is impregnated into or applied to the glass cloth (A) and then semi-cured by heating in a drier at 100 to 200° C. for 1 to 60 minutes.

The volume content of the glass cloth (A) in the prepreg of the invention is 32% to 42%, preferably 33% to 42%. When the volume content of the glass cloth (A) is less than 32%, the effect of reducing the thermal expansion coefficient is small, while when the volume content of the glass cloth (A) exceeds 42%, the formability of the prepreg is deteriorated. Moreover, the volume content of the glass cloth in the prepreg is calculated from a laminate produced using the same. Also, the volume content of the glass cloth in the laminate is calculated according to the following equation formula:

Volume content (%)=(T2−(W2/G)×S×1000)×100/T2 when thickness of an insulating layer in the laminate is T2 (μm), the weight per 1 m² of the glass cloth used is W2 (g/m²), the specific gravity of the glass is G (g/cm³), and the number of glass cloths included in the laminate is S (glass cloth).

In the resin varnish, it is possible to use an organic solvent, if required. The organic solvent is not particularly limited as long as it can dissolve a mixture of the cyanate resin (E) and the non-halogen based epoxy resin (C). As a concrete example of the organic solvent are included ketones such as acetone, methyl ethyl ketone, methyl isobutyl ketone, cyclohexanone and the like; aromatic hydrocarbons such as benzene, toluene, xylene and the like; amides such as dimethylformamide and dimethylacetoamide and the like.

The laminate of the invention is a laminate formed using the prepreg described above. The laminate is specifically produced by lamination molding of a structure that a foil of a metal such as copper, aluminum or the like is placed on one side or both sides of one prepreg or plural piled prepregs as desired. The metal foil used is not particularly limited as long as it is the one used in printed wiring board materials, and includes a copper foil and the like, for example. Also, as lamination molding conditions can be applied normal lamination molding conditions on laminates and multilayer plates for printed wiring boards. For example, there are commonly the use of a multistage press, a multistage vacuum press, a continuous molding machine, an autoclave molding machine or the like, a temperature of 100 to 130° C., a pressure of 2 to 100 kgf/cm², and a heating time of 0.05 to 5 hours. Moreover, post-curing may be conducted at a temperature of 150 to 300° C., if required.

EXAMPLES

Although Synthesis Examples, Examples and Comparative Examples are shown below to describe the invention in detail, the invention is not limited thereto.

Synthesis Example 1

Synthesis-1 of α-Naphthol Aralkyl Type Cyanate Resin 103 g (OH group 0.47 mole) of α-naphthol aralkyl resin (SN485, OH group equivalent: 219 g/eq., softening point: 86°

C., made by Nippon Steel Chemical Co., Ltd.) represented by the following general formula (3):

[Chemical Formula 3]

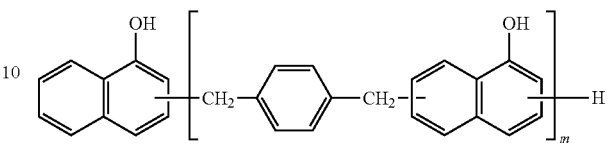

(3)

is dissolved in 500 ml of chloroform, and added and mixed with 0.7 mole of triethylamine, which is added dropwise to 300 g of a solution of 0.93 mole of cyanogen chloride in chloroform at −10° C. over 1.5 hours and stirred for 30 minutes, and added dropwise with a mixed solution of 0.1 mole of triethylamine and 30 g of chloroform and stirred for 30 minutes to complete the reaction. The resulting triethylamine hydrochloride is filtered off, and the thus obtained filtrate is washed with 500 ml of 0.1 N hydrochloric acid and then washed with 500 ml of water four times. Next, a chloroform layer is extracted from the chloroform/water mixed solution by separation treatment, and then sodium sulfate is added to the chloroform solution to conduct dehydration treatment. After sodium sulfate is filtered off, the resulting mass is evaporated at 75° C. and further deaerated under vacuum at 90° C. to obtain a brown solid of α-naphthol aralkyl type cyanate resin represented by the following general formula (4):

[Chemical Formula 4]

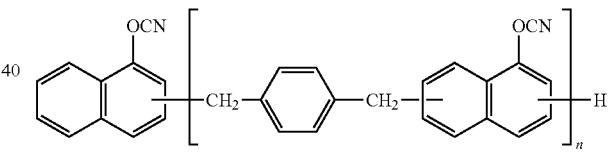

(4)

In an infrared absorption spectrum is confirmed an absorption of cyanate group in the proximity of 2264 cm⁻¹. Also, the conversion from OH group to OCN group as calculated from ¹³C-NMR and ¹H-NMR is not less than 99%. Furthermore, from differential refractive index detection in GPC, the percentage of compounds with n of 1 to 4 is 93% by weight.

Synthesis Example 2

Synthesis-2 of α-Naphthol Aralkyl Type Cyanate Resin

An α-naphthol aralkyl type cyanate resin represented by the above general formula (4) is synthesized by the same method as in Synthesis Example 1 except that 102 g (OH group 0.45 mole) of α-naphthol aralkyl resin (SN4105, OH group equivalent: 226 g/eq., softening point: 105° C., made by Nippon Steel Chemical Co., Ltd.) is used in stead of the α-naphthol aralkyl resin (SN485, OH group equivalent: 219 g/eq., softening point: 86° C., made by Nippon Steel Chemical Co., Ltd.) and the amount of cyanogen chloride used is 0.90 mole. In an infrared absorption spectrum is confirmed an absorption of cyanate group in the proximity of 2264 cm⁻¹.

Also, the conversion from OH group to OCN group as calculated from $^{13}$C-NMR and $^1$H-NMR is not less than 99%. Furthermore, from differential refractive index detection in GPC, the percentage of compounds with n of 1 to 4 is 75% by weight.

Compounding Example 1

60 parts by weight of α-naphthol aralkyl type cyanate resin (cyanate equivalent: 237 g/eq.) prepared in Synthesis Example 1 and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3 parts by weight of a wet dispersant (disperbyk-161, made by BYK-Chemie Japan Co., Ltd.), 110 parts by weight of spherical fused silica (SC2050MB, made by Admatechs Co., Ltd.) and 0.02 parts by weight of zinc octylate to obtain a varnish.

Compounding Example 2

36 parts by weight of α-naphthol aralkyl type cyanate resin (cyanate equivalent: 237 g/eq.) prepared in Synthesis Example 1, 24 parts by weight of bis(3-ethyl-5-methyl-4-maleimidophenyl)methane (BMI-70, made by KI Chemical Industries Co., Ltd.) and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3 parts by weight of a wet dispersant (disperbyk-161, made by BYK-Chemie Japan Co., Ltd.), 110 parts by weight of spherical fused silica (SC2050MB, made by Admatechs Co., Ltd.) and 0.02 parts by weight of zinc octylate to obtain a varnish.

Compounding Example 3

60 parts by weight of prepolymer of 2,2-bis(4-cyanatophenyl)propane (BT2070, cyanate equivalent: 139 g/eq., made by Mitsubishi Gas Chemical Co., Ltd.) and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3 parts by weight of a wet dispersant (disperbyk-161, made by BYK-Chemie Japan Co., Ltd.), 110 parts by weight of spherical fused silica (SC2050MB, made by Admatechs Co., Ltd.) and 0.02 parts by weight of zinc octylate to obtain a varnish.

Compounding Example 4

36 parts by weight of prepolymer of 2,2-bis(4-cyanatophenyl)propane (BT2070, cyanate equivalent: 139 g/eq., made by Mitsubishi Gas Chemical Co., Ltd.), 24 parts by weight of bis(3-ethyl-5-methyl-4-maleimidophenyl)methane (BMI-70, made by KI Chemical Industry) and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3 parts by weight of a wet dispersant (disperbyk-161, made by BYK-Chemie Japan Co., Ltd.), 110 parts by weight of spherical fused silica (SC2050MB, made by Admatechs Co., Ltd.) and 0.02 parts by weight of zinc octylate to obtain a varnish.

Compounding Example 5

60 parts by weight of α-naphthol aralkyl type cyanate resin (cyanate equivalent: 237 g/eq.) prepared Synthesis Example 2 and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3.0 parts by weight of a wet dispersant (BKY-W996, made by BYK-Chemie Japan Co., Ltd.), 120 parts by weight of boehmite (BN100, made by Kawai Lime Industries Co., Ltd.) and 0.02 parts by weight of zinc octylate to obtain a varnish.

Compounding Example 6

36 parts by weight of α-naphthol aralkyl type cyanate resin (cyanate equivalent: 237 g/eq.) prepared in Synthesis Example 2, 24 parts by weight of bis(3-ethyl-5-methyl-4-maleimidophenyl)methane (BMI-70, made by KI Chemical Industries Co., Ltd.) and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3.0 parts by weight of a wet dispersant (BKY-W996, made by BYK-Chemie Japan Co., Ltd.), 120 parts by weight of boehmite (BN100, made by Kawai Lime Industries Co., Ltd.) and 0.02 parts by weight of zinc octylate to obtain a varnish.

Compounding Example 7

60 parts by weight of α-naphthol aralkyl type cyanate resin (cyanate equivalent: 237 g/eq.) prepared in Synthesis Example 2 and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3 parts by weight of a wet dispersant (disperbyk-161, made by BYK-Chemie Japan Co., Ltd.), 140 parts by weight of glass beads (EMB10, made by Potters-Ballotini Co., Ltd.) and 0.02 parts by weight of zinc octylate to obtain a varnish.

Compounding Example 8

36 parts by weight of α-naphthol aralkyl type cyanate resin (cyanate equivalent: 237 g/eq.) prepared in Synthesis Example 2, 24 parts by weight of bis(3-ethyl-5-methyl-4-maleimidophenyl)methane (BMI-70, made by KI Chemical Industry) and 40 parts by weight of phenol biphenyl aralkyl type epoxy resin (NC-3000-FH, epoxy equivalent: 320 g/eq., made by Nippon Kayaku Co., Ltd.) are dissolved and mixed in methyl ethyl ketone, and further mixed with 3 parts by weight of a wet dispersant (disperbyk-161, made by BYK-Chemie Japan Co., Ltd.), 140 parts by weight of glass beads (EMB 10, made by Potters-Ballotini Co., Ltd.) and 0.02 parts by weight of zinc octylate to obtain a varnish.

Compounding Example 9

A varnish is obtained in the same manner as in Compounding Example 1 except that the amount of spherical fused silica (SC2050MB, made by Admatechs Co., Ltd.) in Example 1 is changed to 200 parts by weight.

<Preparation of Prepreg>

Example 1

Into an E-glass woven cloth (E03R-UK made by Unitika Glass Fiber Co., Ltd.) wherein the thickness is 26 μm and the weight per 1 m$^2$ is 31.0 g/m$^2$ (when the weight per 1 m$^2$ of the glass cloth is W (g/m$^2$) and the thickness of the glass cloth is t (μm), W/t is 1.19), and an end count per inch is 90 warp threads/inch and 90 weft threads/inch using yarns (C1200) composed of 100 monofilaments with an average diameter in section of 3.5 to 5.1 μm is impregnated and applied the varnish prepared in Compounding Example 1 and diluted with methyl ethyl ketone, which is dried by heating at 160° C. for 4 minutes to obtain a prepreg with a volume content of glass cloth of 37% by volume.

Example 2

A prepreg with a volume content of glass cloth of 37% by volume is obtained in the same manner as in Example 1 except that the varnish used in Example 1 is changed to the varnish described in Compounding Example 2.

Example 3

The varnish prepared in Compounding Example 3 and diluted with methyl ethyl ketone is impregnated and applied instead of the varnish used in Example 1 and dried by heating at 160° C. for 4 minutes to obtain a prepreg with a volume content of glass cloth of 37% by volume.

Example 4

A prepreg with a volume content of glass cloth of 37% by volume is obtained in the same manner as in Example 1 except that the varnish used in Example 1 is changed to the varnish described in Compounding Example 4.

Example 5

Into an E-glass woven cloth (E02R-UK made by Unitika Glass Fiber Co., Ltd.) wherein the thickness is 20 μm and the weight per 1 m$^2$ is 24.0 g/m$^2$ (when the weight per 1 m$^2$ of the glass cloth is W (g/m$^2$) and the thickness of the glass cloth is t (μm), W/t is 1.20), and an end count per inch is 95 warp threads/inch and 90 weft threads/inch using yarns (BC1500) each composed of 100 monofilaments with an average diameter in section of 3.5 to 4.7 μm is impregnated and applied the varnish prepared in Compounding Example 5 and diluted with methyl ethyl ketone, which is dried by heating at 160° C. for 4 minutes to obtain a prepreg with a volume content of glass cloth of 37% by volume.

Example 6

A prepreg with a volume content of glass cloth of 37% by volume is obtained in the same manner as in Example 5 except that the varnish used in Example 5 is changed to the varnish described in Compounding Example 6.

Example 7

A prepreg with a volume content of glass cloth of 37% by volume is obtained in the same manner as in Example 5 except that the varnish used in Example 5 is changed to the varnish described in Compounding Example 7.

Example 8

A prepreg with a volume content of glass cloth of 37% by volume is obtained in the same manner as in Example 5 except that the varnish used in Example 5 is changed to the varnish described in Compounding Example 8.

Comparative Example 1

A prepreg with a volume content of glass cloth of 31% by volume is obtained in the same manner as in Example 1 except that an E-glass woven cloth (E03E-UK made by Unitika Glass Fiber Co., Ltd.) wherein the thickness is 25 μm and the weight per 1 m$^2$ is 23.7 g/m$^2$ (when the weight per 1 m$^2$ of the glass cloth is W (g/m$^2$) and the thickness of the glass cloth is t (μm), W/t is 0.95), and an end count per inch is 69 warp threads/inch and 72 weft threads/inch using yarns (C1200) each composed of 100 monofilaments with an average diameter in section of 3.5 to 5.1 μm is used instead of the E-glass woven cloth used in Example 1.

Comparative Example 2

A prepreg with a volume content of glass cloth of 31% by volume is obtained in the same manner as in Example 2 except that an E-glass woven cloth (E03E-UK made by Unitika Glass Fiber Co., Ltd.) wherein the thickness is 25 μm and the weight per 1 m$^2$ is 23.7 g/m$^2$ (when the weight per 1 m$^2$ of the glass cloth is W (g/m$^2$) and the thickness of the glass cloth is t (μm), W/t is 0.95), and an end count per inch is 69 warp threads/inch and 72 weft threads/inch using yarns (C1200) each composed of 100 monofilaments with an average diameter in section of 3.5 to 5.1 μm is used instead of the E-glass woven cloth used in Example 2.

Comparative Example 3

A prepreg with a volume content of glass cloth of 31% by volume is obtained in the same manner as in Example 3 except that an E-glass woven cloth (E03E-UK made by Unitika Glass Fiber Co., Ltd.) wherein the thickness is 25 μm and the weight per 1 m$^2$ is 23.7 g/m$^2$ (when the weight per 1 m$^2$ of the glass cloth is W (g/m$^2$) and the thickness of the glass cloth is t (μm), W/t is 0.95), and an end count per inch is 69 warp threads/inch and 72 weft threads/inch using yarns (C1200) each composed of 100 monofilaments with an average diameter in section of 3.5 to 5.1 μm is used instead of the E-glass woven cloth used in Example 3.

Comparative Example 4

A prepreg with a volume content of glass cloth of 31% by volume is obtained in the same manner as in Example 4 except that an E-glass woven cloth (E03E-UK made by Unitika Glass Fiber Co., Ltd.) wherein the thickness is 25 μm and the weight per 1 m$^2$ is 23.7 g/m$^2$ (when the weight per 1 m$^2$ of the glass cloth is W (g/m$^2$) and the thickness of the glass cloth is t (μm), W/t is 0.95), and an end count per inch is 69 warp threads/inch and 72 weft threads/inch using yarns (C1200) each composed of 100 monofilaments with an average diameter in section of 3.5 to 5.1 μm is used instead of the E-glass woven cloth used in Example 4.

Comparative Example 5

Into an E-glass woven cloth (E03E-UK made by Unitika Glass Fiber Co., Ltd.) wherein the thickness is 25 μm and the weight per 1 m$^2$ is 23.7 g/m$^2$ (when the weight per 1 m$^2$ of the glass cloth is W (g/m$^2$) and the thickness of the glass cloth is t (μm), W/t is 0.95), and an end count per inch is 69 warp threads/inch and 72 weft threads/inch using yarns (C1200) each composed of 100 monofilaments with an average diameter in section of 3.5 to 5.1 μm is impregnated and applied the varnish prepared in Compounding Example 9 and diluted with methyl ethyl ketone, which is dried by heating at 160° C. for 4 minutes to obtain a prepreg with a volume content of glass cloth of 31% by volume.

Comparative Example 6

A prepreg with a volume content of glass cloth of 31% by volume is obtained in the same manner as in Example 5 except that an E-glass woven cloth (1027 made by Asahi Kasei Microdevices Co., Ltd.) wherein the thickness is 22 μm and the weight per 1 m² is 19.7 g/m² (when the weight per 1 m² of the glass cloth is W (g/m²) and the thickness of the glass cloth is t (μm), W/t is 0.89), and an end count per inch is 74 warp threads/inch and 74 weft threads/inch using yarns (BC1500) each composed of 100 monofilaments with an average diameter in section of 3.5 to 4.7 μm is used instead of the E-glass woven cloth used in Example 5.

Comparative Example 7

A prepreg with a volume content of glass cloth of 31% by volume is obtained in the same manner as in Example 6 except that an E-glass woven cloth (1027 made by Asahi Kasei Microdevices Co., Ltd.) wherein the thickness is 22 μm and the weight per 1 m² is 19.7 g/m² (when the weight per 1 m² of the glass cloth is W (g/m²) and the thickness of the glass cloth is t (μm), W/t is 0.89), and an end count per inch is 74 warp threads/inch and 74 weft threads/inch using yarns (BC1500) each composed of 100 monofilaments with an average diameter in section of 3.5 to 4.7 μm is used instead of the E-glass woven cloth used in Example 6.

Comparative Example 8

A prepreg with a volume content of glass cloth of 31% by volume is obtained in the same manner as in Example 7 except that an E-glass woven cloth (1027 made by Asahi Kasei Microdevices Co., Ltd.) wherein the thickness is 22 μm and the weight per 1 m² is 19.7 g/m² (when the weight per 1 m² of the glass cloth is W (g/m²) and the thickness of the glass cloth is t (μm), W/t is 0.89), nd an end count per inch is 74 warp threads/inch and 74 weft threads/inch using yarns (BC1500) each composed of 100 monofilaments with an average diameter in section of 3.5 to 4.7 μm is used instead of the E-glass woven cloth used in Example 7.

Comparative Example 9

A prepreg with a volume content of glass cloth of 31% by volume is obtained in the same manner as in Example 8 except that an E-glass woven cloth (1027 made by Asahi Kasei Microdevices Co., Ltd.) wherein the thickness is 22 μm and the weight per 1 m² is 19.7 g/m² (when the weight per 1 m² of the glass cloth is W (g/m²) and the thickness of the glass cloth is t (μm), W/t is 0.89), and an end count per inch is 74 warp threads/inch and 74 weft threads/inch using yarns (BC1500) each composed of 100 monofilaments with an average diameter in section of 3.5 to 4.7 μm is used instead of the E-glass woven cloth used in Example 8.

(Preparation of Copper-Clad Laminate-1)

Two prepregs obtained in each of Examples 1 to 4 and Comparative Examples 1 to 5 are piled together, and electrolyte copper foils of 12 μm in thickness (3EC-III, made by Mitsui Mining & Smelting Co., Ltd.) are disposed on both sides thereof, which is subjected to lamination molding at a pressure of 30 kgf/cm² and a temperature of 220° C. for 120 minutes to obtain a copper-clad laminate with a thickness of 0.060 mm.

(Preparation of Copper-Clad Laminate-2)

Two prepregs obtained in each of Examples 5 to 8 and Comparative Examples 6 to 9 are piled together, and electrolyte copper foils of 12 μm in thickness (3EC-III, made by Mitsui Mining & Smelting Co., Ltd.) are disposed on both sides thereof, which is subjected to lamination molding at a pressure of 30 kgf/cm² and a temperature of 220° C. for 120 minutes to obtain a copper-clad laminate with a thickness of 0.050 mm.

(Preparation of Copper-Clad Laminate-3)

Two prepregs obtained in each of Examples 1 to 4 and Comparative Examples 1 to 5 are piled together, and electrolyte copper foils of 3 μm in thickness (MT-SDH, made by Mitsui Mining & Smelting Co., Ltd/) are disposed on both sides thereof, which is subjected to lamination molding at a pressure of 30 kgf/cm² and a temperature of 220° C. for 120 minutes to obtain a copper-clad laminate with a thickness of 0.060 mm.

(Preparation of Copper-Clad Laminate-4)

Two prepregs obtained in each of Examples 5 to 8 and Comparative Examples 6 to 9 are piled together, and electrolyte copper foils of 3 μm in thickness (MT-SDH, made by Mitsui Mining & Smelting Co., Ltd.) are disposed on both sides thereof, which is subjected to lamination molding at a pressure of 30 kgf/cm² and a temperature of 220° C. for 120 minutes to obtain a copper-clad laminate with a thickness of 0.050 mm.

The flame retardance, thermal expansion coefficient and flexible volume are evaluated using the copper-clad laminate-1 and copper-clad laminate-2. The results are shown in Table 1 and Table 2.

The evaluation of flame retardance and the measurements of thermal expansion coefficient and flexible volume are conducted by the following methods after the copper foil is removed by etching the copper-clad laminate.

The thickness, weight and end count of the glass cloth are measured according to JIS R3420.

Flame test: It is evaluated according to UL94 vertical flame test.

Thermal expansion coefficient: The linear expansion coefficient in plane direction from 60° C. to 120° C. is measured with a thermomechanical analysis instrument (made by TA Instruments) by raising the temperature at a rate of 10° C./min from 40° C. to 340° C. The measurement is carried out in both directions of warp thread (Y) and weft thread (X) of the glass cloth.

Flexible volume: A test specimen with a horizontal length of 20 mm and a vertical length of 200 mm is prepared and placed on an upper surface of a horizontal table such that one end of the test specimen is horizontally projected from the edge of the table by 100 mm and the other end is fixed on the upper surface of the table. Then, a distance in the vertical direction is measured between the upper surface of the table and the position of front end when the projected portion of the test specimen is deformed downwards by its own weight.

The drillability is evaluated by measuring the number of hits until a drill bit is broken under the following drilling conditions using the copper-clad laminate-3 and copper-clad laminate-4.

Processing machine: ND-1 V212 made by Hitachi Via Mechanics Co., Ltd.

Number of piles: 8 copper-clad laminates

Entry sheet: LE808F3 made by Mitsubishi Gas Chemical Co., Ltd.

Backup board: PS-1160D made by Risho Kogyo Co., Ltd.

Drill bit: MD 0.105×1.6 J492B made by Union Tool Co., Ltd.

Number of revolutions: 200 krpm

Feed speed: 2.0 m/min

Number of hits: 10000

TABLE 1

|  | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|
| Thermal expansion coefficient in Y direction | 10.0 | 10.0 | 10.0 | 10.1 | 12.7 | 12.7 | 12.7 | 12.7 | 11.6 |
| Thermal expansion coefficient in X direction | 10.2 | 10.2 | 10.2 | 10.3 | 12.9 | 12.9 | 12.9 | 12.9 | 11.4 |
| Flexible volume | 31 | 31 | 30 | 31 | 42 | 42 | 42 | 42 | 38 |
| Number of hits for breaking drill bit | >10000 | >10000 | >10000 | >10000 | >10000 | >10000 | >10000 | >10000 | 7892 |
| Flame retardance | V-0 | V-0 | V-1 | V-1 | V-0 | V-0 | V-1 | V-1 | V-0 |

Unit Thermal expansion coefficient: ppm/° C., Flexible volume: mm

TABLE 2

|  | Example 5 | Example 6 | Example 7 | Example 8 | Comparative Example 6 | Comparative Example 7 | Comparative Example 8 | Comparative Example 9 |
|---|---|---|---|---|---|---|---|---|
| Thermal expansion coefficient in Y direction | 11.4 | 11.6 | 12.1 | 12.1 | 13.5 | 13.5 | 13.9 | 13.9 |
| Thermal expansion coefficient in X direction | 11.5 | 11.6 | 12.3 | 12.2 | 13.7 | 13.7 | 14.1 | 14.1 |
| Flexible volume | 42 | 42 | 44 | 44 | 51 | 51 | 52 | 53 |
| Number of hits for breaking drill bit | >10000 | >10000 | >10000 | >10000 | >10000 | >10000 | >10000 | >10000 |
| Flame retardance | V-0 | V-0 | V-0 | V-0 | V-0 | V-0 | V-0 | V-0 |

Unit Thermal expansion coefficient: ppm/° C., Flexible volume: mm

Table 1 shows evaluation/measurement results of the copper-clad laminates with a thickness of 0.060 mm. As shown in this table, Examples 1 to 4 according to the invention are low in the thermal expansion coefficient and small in the flexible volume as compared to Comparative Examples 1 to 4 using the E-glass woven cloth with the small end count. Moreover, Examples 1 to 4 are superior results in drillability than Comparative Example 5 using the same E-glass woven cloth as Comparative Examples 1 to 4 and having low thermal expansion coefficient due to increased amount of inorganic filler.

Table 2 shows evaluation/measurement results of the copper-clad laminates with a thickness of 0.050 mm. As shown in this table, Examples 5 to 8 according to the invention are low in the thermal expansion coefficient and small in the flexible volume as compared to Comparative Examples 6 to 9 using the glass cloth with the small end count.

The invention claimed is:

1. A prepreg composed of (A) a glass cloth with a resin composition comprising (B) a cyanate resin, (C) a non-halogen based epoxy resin and (D) an inorganic filler, wherein the weight per 1 m² in said glass cloth (A) is W (g/m²), thickness is t (μm), end count of warp threads per inch is X (thread/inch), and end count of weft threads per inch is Y (thread/inch), the total of X and Y is 150 to 240, t is 17 to 35, and the value of W/t as an apparent density is 1.1 to 1.5, and that volume content of the glass cloth (A) in the prepreg is 32% to 42%.

2. A prepreg according to claim 1, wherein the cyanate resin (B) is a cyanate resin represented by the following general formula (1),

[Chemical Formula 1]

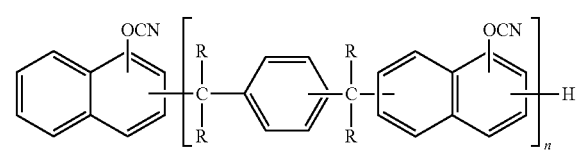

(1)

wherein each R independently represents a hydrogen atom or a methyl group, and n represents an integer of not less than 1.

3. A laminate obtained by curing a prepreg as claimed in claim 1.

4. A metal foil-clad laminate obtained by curing a laminate of a prepreg as claimed in claim 1 and a metal foil.

5. A laminate obtained by curing a prepreg as claimed in claim 2.

6. A metal foil-clad laminate obtained by curing a laminate of a prepreg as claimed in claim 2 and a metal foil.

* * * * *